United States Patent
Kim et al.

(10) Patent No.: US 8,710,655 B2
(45) Date of Patent: Apr. 29, 2014

(54) DIE PACKAGES AND SYSTEMS HAVING THE DIE PACKAGES

(75) Inventors: Hyun-Joong Kim, Yongin-si (KR); Jang Seok Choi, Seoul (KR); Chul-Hwan Choo, Paju-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/546,517

(22) Filed: Jul. 11, 2012

(65) Prior Publication Data

US 2013/0161812 A1 Jun. 27, 2013

(30) Foreign Application Priority Data

Dec. 21, 2011 (KR) ........................ 10-2011-0139360

(51) Int. Cl.
*H01L 23/48* (2006.01)
*H05K 7/20* (2006.01)

(52) U.S. Cl.
USPC .............. 257/737; 257/E23.021; 257/E23.01; 257/E23.141; 257/E23.011; 257/738; 257/777; 257/686; 257/685; 257/723; 257/724; 257/728; 257/774; 257/773; 361/709; 711/133; 716/117

(58) Field of Classification Search
USPC ......... 257/737, 738, 777, 686, 685, 723, 724, 257/728, E23.141, 774, E23.011, 773, 257/E23.021, E23.01; 711/133, E12.07; 716/117, 306; 361/709
See application file for complete search history.

(56) References Cited

U.S. PATENT DOCUMENTS

| | | | |
|---|---|---|---|
| 7,385,281 B2 | 6/2008 | Nishio et al. | |
| 7,578,676 B2 | 8/2009 | Sukegawa et al. | |
| 8,008,764 B2 | 8/2011 | Joseph et al. | |
| 2010/0315787 A1* | 12/2010 | Li et al. | 361/709 |
| 2011/0291261 A1* | 12/2011 | Fleischman et al. | 257/737 |
| 2012/0020040 A1* | 1/2012 | Lin et al. | 361/772 |
| 2012/0211885 A1* | 8/2012 | Choi et al. | 257/737 |
| 2012/0228760 A1* | 9/2012 | Lim et al. | 257/737 |
| 2013/0037802 A1* | 2/2013 | England et al. | 257/48 |
| 2013/0049224 A1* | 2/2013 | Sutardja | 257/774 |
| 2013/0054849 A1* | 2/2013 | Loh et al. | 710/100 |
| 2013/0073755 A1* | 3/2013 | Sadowski et al. | 710/105 |
| 2013/0120021 A1* | 5/2013 | Chi | 326/37 |
| 2013/0159587 A1* | 6/2013 | Nygren et al. | 710/306 |
| 2013/0159630 A1* | 6/2013 | Lichmanov | 711/133 |
| 2013/0161812 A1* | 6/2013 | Kim et al. | 257/737 |
| 2013/0168871 A1* | 7/2013 | Kim et al. | 257/774 |
| 2013/0175702 A1* | 7/2013 | Choi et al. | 257/774 |
| 2013/0181257 A1* | 7/2013 | Ngai | 257/209 |

* cited by examiner

*Primary Examiner* — Alexander Oscar Williams
(74) *Attorney, Agent, or Firm* — Harness, Dickey & Pierce, PLC

(57) ABSTRACT

A die package may include a package substrate; an interposer; and/or at least one first die connected between the package substrate and the interposer. The die package may further include at least one second die mounted on the interposer and/or a processor. A system may include a system board and/or a die package mounted on the system board. The die package may include a package substrate; an interposer; and/or at least one first die connected between the package substrate and the interposer. The system may further include at least one second die mounted on the interposer and/or a processor. The processor may control data processing operations of the at least one first die and/or the at least one second die.

20 Claims, 9 Drawing Sheets

DIE PACKAGES AND SYSTEMS HAVING THE DIE PACKAGES

CROSS-REFERENCE TO RELATED APPLICATION(S)

This application claims priority from Korean Patent Application No. 10-2011-0139360, filed on Dec. 21, 2011, in the Korean Intellectual Property Office (KIPO), the entire contents of which are incorporated herein by reference.

BACKGROUND

1. Field

Example embodiments relate to circuit packaging. Example embodiments also relate to die packages that may reduce the process burden of die packages and/or overhead of die sizes. Additionally, example embodiments relate to systems including the same.

2. Description of the Related Art

A semiconductor wafer includes hundreds or thousands of chips on which identical electrical circuits are printed. Each of the chips may not communication with the outside by itself. The semiconductor packaging is to connect electrical wiring to each of the chips for communicating with the outside and to seal the chips to sustain external shock, for example, physical shock or chemical shock.

The semiconductor packaging, also referred to as a die packaging, is the final process in manufacturing semiconductor devices. A die denoting a quadrangle piece of semiconductor wafer may be referred to as a chip or an integrated circuit (IC).

The performance of a semiconductor device may be decided by semiconductor packaging process packaging the die rather than by the performance of the die itself. Therefore, the semiconductor packaging is important. When a plurality of dies are stacked in one package, it is difficult to stack the plurality of dies as the number of the dies increases.

SUMMARY

Example embodiments provide die packages that may include a package substrate, an interposer, and/or at least one first die connected between the package substrate and the interposer. In example embodiments, the die package may further include at least one second die mounted on the interposer and/or a processor.

In some example embodiments, a die package may include a package substrate; an interposer; and/or at least one first die connected between the package substrate and the interposer.

In some example embodiments, the die package may further include at least one second die mounted on the interposer and/or a processor.

In some example embodiments, the processor may be connected to the interposer through microbumps.

In some example embodiments, wherein when the at least one first die is embodied by two stacked dies, either one of the two stacked dies may include vertical electrical connections, while the other one of the two stacked dies may not include vertical electrical connections.

In some example embodiments, the two stacked dies may be connected through the vertical electrical connections.

In some example embodiments, either one of the two stacked dies may be connected to the interposer through microbumps.

In some example embodiments, the at least one first die and the at least one second die may be disposed in-line.

In some example embodiments, the at least one first die may be a volatile memory device or a non-volatile memory device.

In some example embodiments, when the at least one second die is embodied by two stacked dies, either one of the two stacked dies may include vertical electrical connections, while the other one of the two stacked dies may not include vertical electrical connections.

In some example embodiments, the two stacked dies may be connected through the vertical electrical connections.

In some example embodiments, a system may include a system board and/or a die package mounted on the system board. The die package may include a package substrate; an interposer; and/or at least one first die connected between the package substrate and the interposer.

In some example embodiments, the system may further include at least one second die mounted on the interposer and/or a processor. The processor may control data processing operations of the at least one first die and/or the at least one second die.

In some example embodiments, the processor may be a central processing unit (CPU) or a graphic processing unit (GPU).

In some example embodiments, the system may further include a display for displaying data processed by the processor.

In some example embodiments, the system may be a portable device.

In some example embodiments, the at least one second die of the die package may be a volatile memory device or a non-volatile memory device.

In some example embodiments, a semiconductor device may include a package substrate; an interposer; and at least one first die connected between the package substrate and the interposer.

In some example embodiments, the die package of the semiconductor device may further include at least one second die mounted on the interposer and/or a processor.

In some example embodiments, a system may include may include a system board and/or a die package mounted on the system board. The die package may include a package substrate; an interposer; and/or at least one first die connected between the package substrate and the interposer.

In some example embodiments, the die package of the system may further include at least one second die mounted on the interposer and/or a processor. The processor may control data processing operations of the at least one first die and/or the at least one second die.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
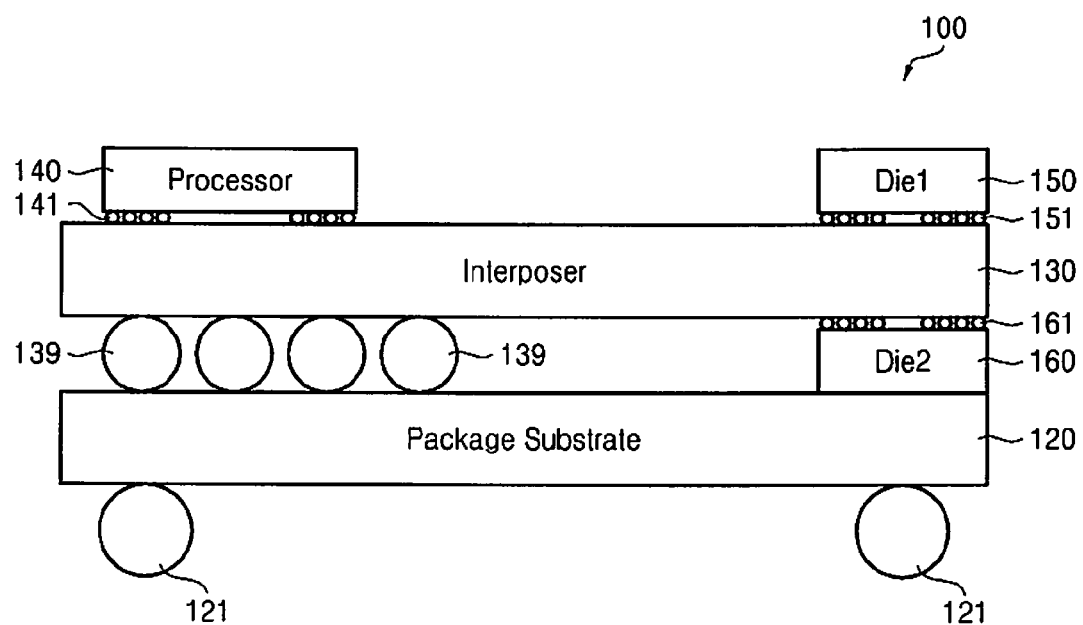
FIG. 1 is a cross-sectional view of a die package according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a cross-sectional view of a die package according to example embodiments. Referring to FIG. 1, the die package 100 may include package substrate 120, interposer 130, processor 140, first die 150, and/or second die 160.

The package substrate 120 may be referred to as a printed circuit board (PCB). A plurality of solder balls 121 may be used for attaching the package substrate 120 to a system board (not shown) or an external device.

The interposer 130 may be mounted on the package substrate 120. A plurality of bumps 139 may be used for attaching the interposer 130 to the package substrate 120. The interposer 130 may be referred to as a silicon interposer.

The processor 140 and/or the first die 150 may be mounted on the interposer 130. The processor 140 may be attached to the interposer 130 through a plurality of microbumps 141. The processor 140 may be a central processing unit (CPU) executing program commands. The processor 140 may be a graphic processing unit (GPU) accelerating image data to be output on a display (not shown).

The first die 150 and/or the second die 160 may be attached to the interposer 130 through first microbumps 151 and second microbumps 161, respectively. The second die 160 may be attached between the package substrate 120 and the interposer 130. The first die 150 and the second die 160 may be disposed in-line.

Each of the first die 150 and the second die 160 may be referred to as an integrated circuit. The first die 150 and/or the second die 160 may be a volatile memory device, such as dynamic random access memory (DRAM), static random access memory (SRAM), thyristor RAM (T-RAM), zero capacitor RAM (Z-RAM), or twin transistor RAM (TTRAM).

When each of the first die 150 and the second die 160 is a volatile memory device, the processor 140 may include a memory controller (not shown) for controlling the operation of the first die 150 and/or the second die 160. The processor 140 may read data output from the first die 150 or the second die 160 and execute other commands (for example, arithmetic command). The die package 100 may include a memory controller instead of the processor 140.

The first die 150 and/or the second die 160 may be a non-volatile memory device, such as Electrically Erasable Programmable Read-Only Memory (EEPROM), flash memory, Magnetic RAM (MRAM), Spin-Transfer Torque MRAM, Conductive bridging RAM (CBRAM), Ferroelectric RAM (FeRAM), Phase change RAM (PRAM), Resistive RAM (RRAM or ReRAM), Nanotube RRAM, Polymer RAM (PoRAM), Nano Floating Gate Memory (NFGM), holographic memory, Molecular Electronics Memory Device, or Insulator Resistance Change Memory.

Figure 2:
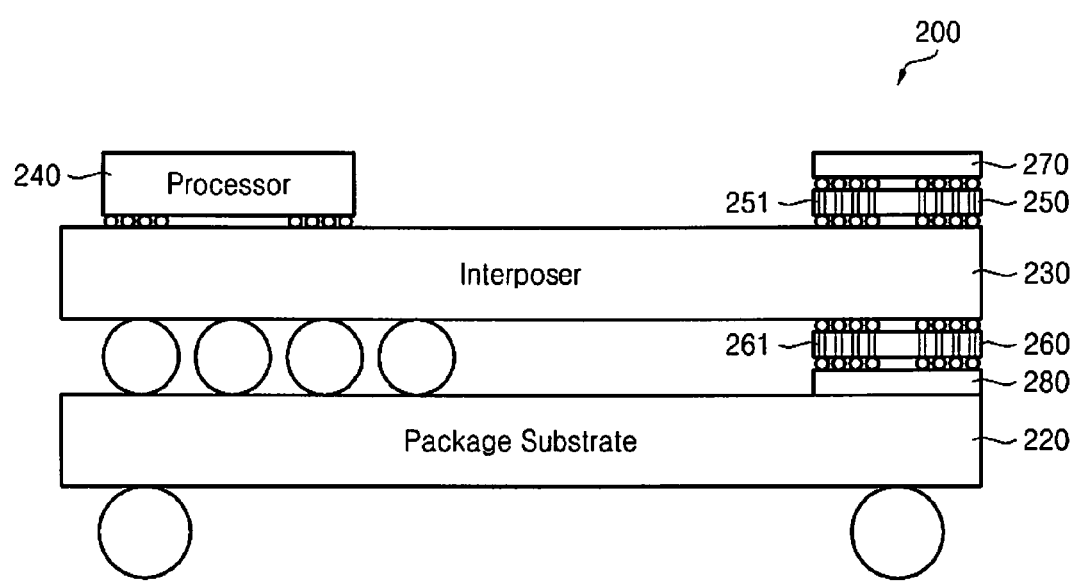
FIG. 2 is a cross-sectional view of a die package according to some example embodiments.

FIG. 2 is a cross-sectional view of a die package according to example embodiments. Referring to FIG. 2, the die package 200 may include package substrate 220, interposer 230, processor 240, and plurality of dies 250, 260, 270, and 280.

The package substrate 220, the interposer 230, and/or the processor 240 may be similar to the package substrate 120, the interposer 130, and/or the processor 140 of FIG. 1 in the operation and the function, thus detailed descriptions thereof are omitted.

A first die 250 may be mounted on the interposer 230. The first die 250 may include first vertical electrical connection means 251. The first vertical electrical connection means 251 may be through silicon vias (TSV). The second die 260 may be attached between the package substrate 220 and the interposer 230. Similarly, the second die 260 may include second vertical electrical connection means 261.

Third die 270 and/or fourth die 280 may be stacked with the first die 250 and/or the second die 260, respectively. The plurality of dies 250, 260, 270, and/or 280 may be disposed in-line. The third die 270 and/or the fourth die 280 may not include vertical electrical connection means, thereby reducing the processing burden of the die package 200 and/or overhead of the die size. The die 250, 260, 270, or 280 may be a volatile memory device or a non-volatile memory device. The number of dies stacked with each other may be different.

Figure 3:
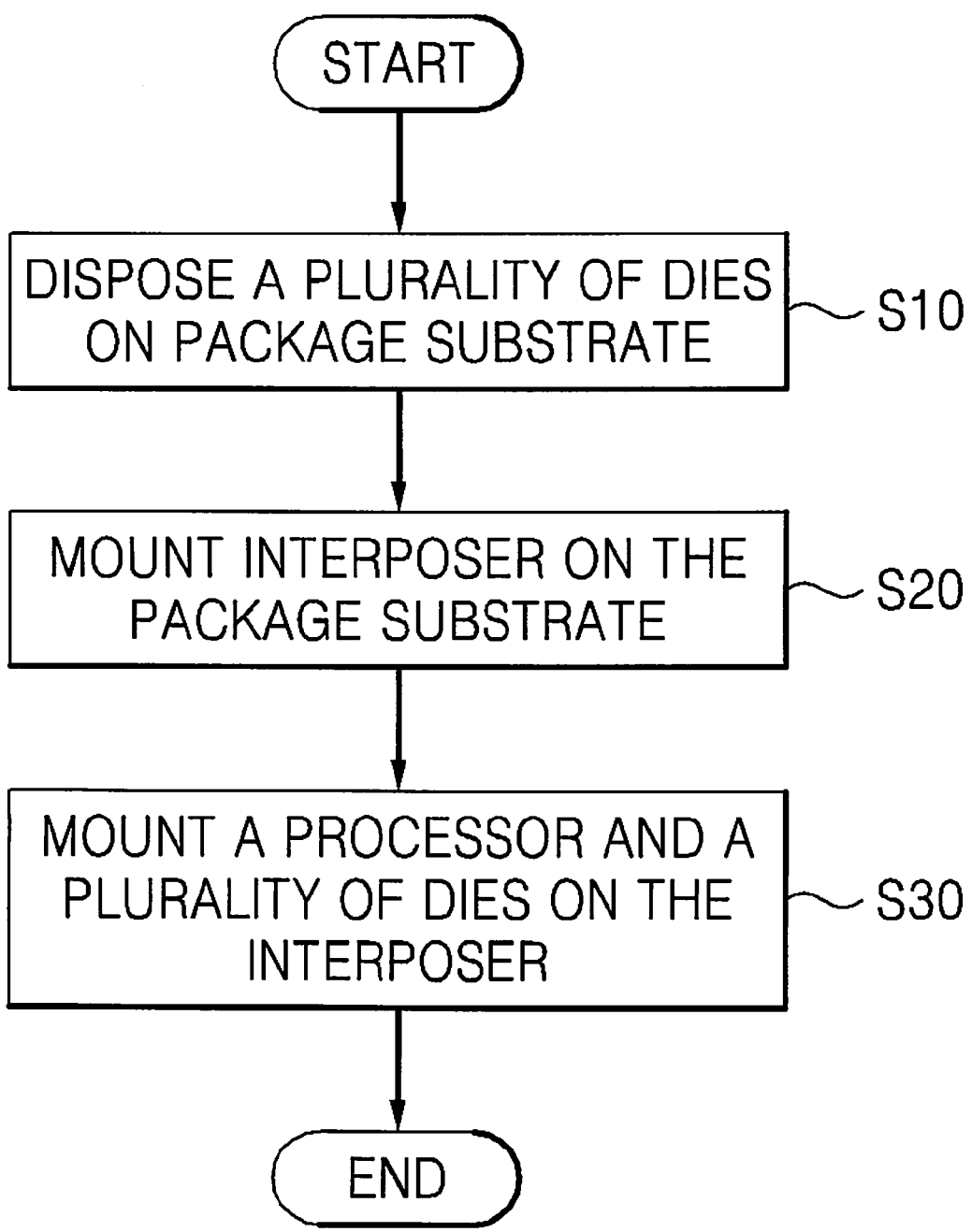
FIG. 3 is a flow chart illustrating a method of manufacturing the die package shown in FIG. 2.

FIG. 3 is a flow chart illustrating a method of manufacturing the die package shown in FIG. 2. Referring to FIGS. 2 and 3, the plurality of dies 260, 280 may be disposed on the package substrate 220 (S10). The second die 260 may include second vertical electrical connection means 261 and/or the fourth die 280 may not include such vertical electrical connection means.

The interposer 230 may be mounted on the package substrate 220 (S20). The processor 240 and/or the dies 250 and 270 may be mounted on the interposer 230 (S30). The first die 250 may include the first vertical electrical connection means 251 and/or the third die 270 may not include such vertical electrical connection means.

The dies 270 and 280 may not include vertical electrical connection means, thereby reducing overhead of the die size. Also, the plurality of dies 250, 260, 270, and 280 may be attached to both sides of the interposer 230, thereby reducing the processing burden of the die package 200.

Figure 4:
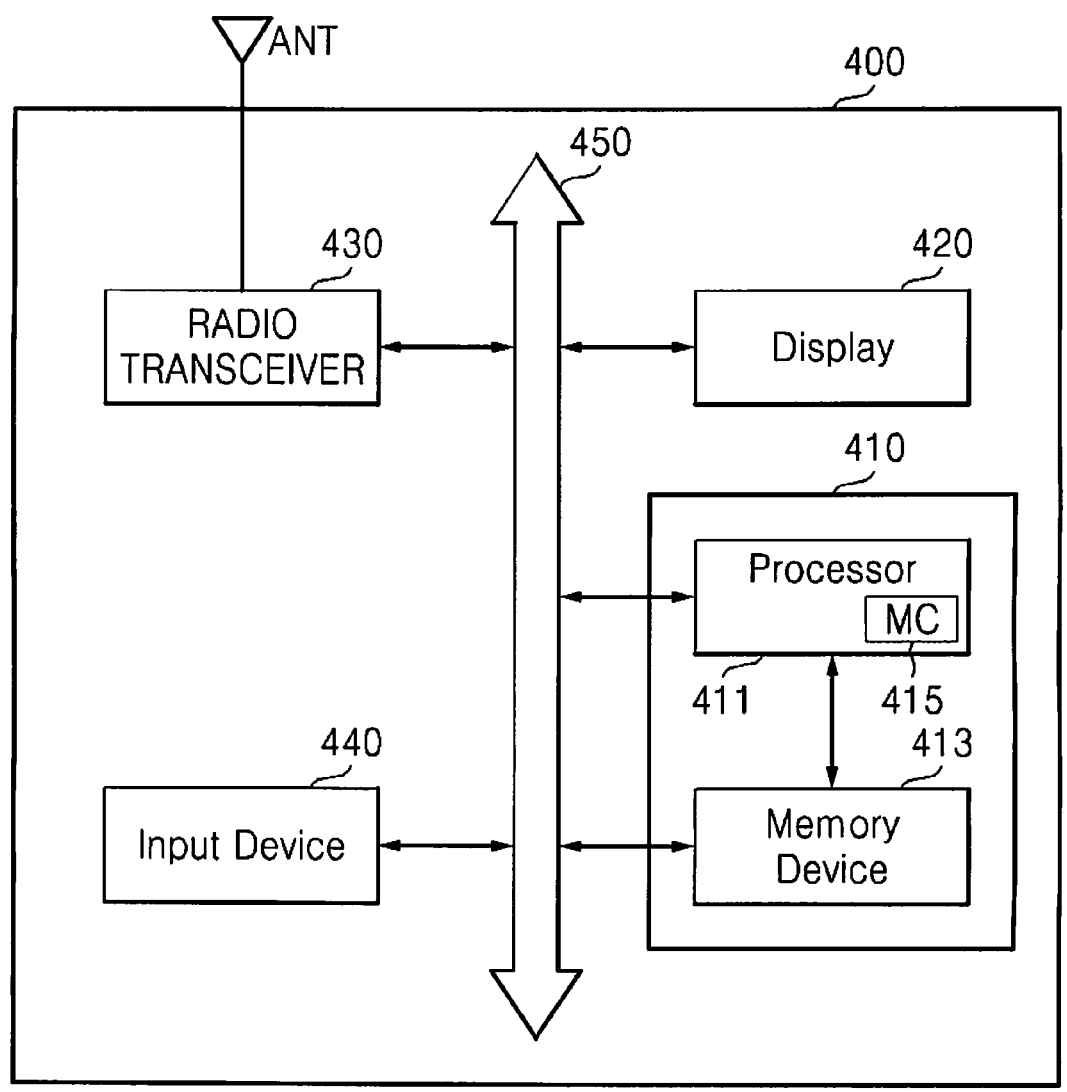
FIG. 4 illustrates an example embodiment of a system including the die package shown in FIG. 1 or 2.

FIG. 4 illustrates an example embodiment of a system having the die package 100, 200 shown in FIG. 1 or 2. Referring to FIG. 4, the system 400 may be embodied into a portable device, such as cellular phone, smart phone, or tablet personal computer (PC). The system 400 may include processor 411, memory device 413, and/or bus 450.

The processor 411 and/or the memory device 413 may be embodied into a die package 410. The die package 410 may be mounted on a system board (not shown). The die package 410 denotes the die package 100 of FIG. 1 or the die package 200 of FIG. 2.

The processor 411 denotes the processor 140 of FIG. 1 or the processor 240 of FIG. 2. The memory device 413 denotes the first die 150, the second die 160 of FIG. 1, a component implemented by combination of the first die 150 and the second die 160, the dies 250, 260, 270, or 280 of FIG. 2, or a component implemented by combination of the dies 250, 260, 270, and 280.

The processor 411 may include a memory controller (MC) 415 for controlling the data process operation of the memory device 413, for example, program operation or read operation. The memory controller 415 may be controlled by the processor 411 controlling the general operation of the system 400.

Data stored in the memory device 413 may be displayed through a display 420 under the control of the processor 411.

A radio transceiver 430 may exchange a radio signal through an antenna ANT. For example, the radio transceiver 430 may convert a radio signal received through the antenna ANT into the signal that the processor 411 may process.

Accordingly, the processor 411 may process a signal output from the radio transceiver 430 and store the processed signal in the memory device 413, or display the processed signal through the display 420. The radio transceiver 430 may convert a signal output from the processor 411 into a radio signal and output the converted radio signal through the antenna ANT.

An input device 440 may be a device for inputting data to be processed by a control signal to control the operation of the processor 411 and/or may be embodied into a pointing device such as touch pad and computer mouse, a keypad, or a keyboard.

The processor 411 may control the display 420 such that data output from the memory device 413, radio signals output from the radio transceiver 430, and/or data output from the input device 440 may be displayed through the display 420.

Figure 5:
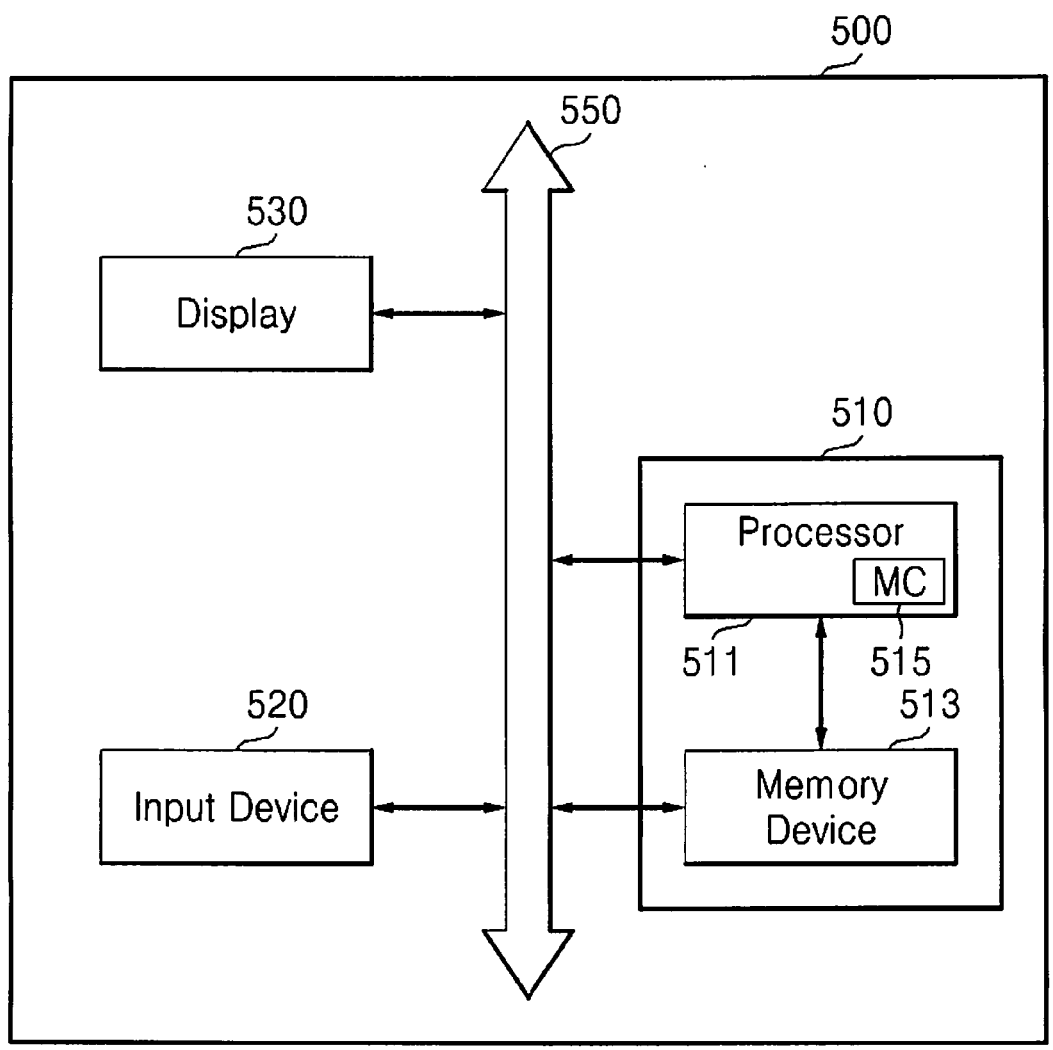
FIG. 5 illustrates an example embodiment of a system including the die package shown in FIG. 1 or 2.

FIG. 5 illustrates an example embodiment of a system having the die package 100, 200 shown in FIG. 1 or 2. Referring to FIG. 5, system 500 may be embodied into personal computer, tablet PC, net-book, e-reader, personal digital assistant (PDA), portable multimedia player (PMP), MP3 player, or MP4 player.

The system 500 may include processor 511 to control the general operation of the system 500, memory device 513, and/or bus 550. The processor 511 and/or the memory device 513 may be embodied into a die package 510. The die package 510 may be mounted on a system board (not shown).

The die package 510 denotes the die package 100 of FIG. 1 or the die package 200 of FIG. 2. The processor 511 denotes the processor 140 of FIG. 1 or the processor 240 of FIG. 2. The memory device 513 denotes the first die 150, the second die 160 of FIG. 1, a component implemented by combination of the first die 150 and the second die 160, the die 250, 260, 270, or 280 of FIG. 2 or a component implemented by combination of the dies 250, 260, 270, and 280.

The processor 511 may include a memory controller 515 for controlling the operation of the memory device 513. The processor 511 may display a data stored in the memory device 513 through a display 530 according to an input signal input from an input device 520. The input device 520 may be embodied into a pointing device, such as touch pad or computer mouse, a keypad, or a keyboard.

Figure 6:
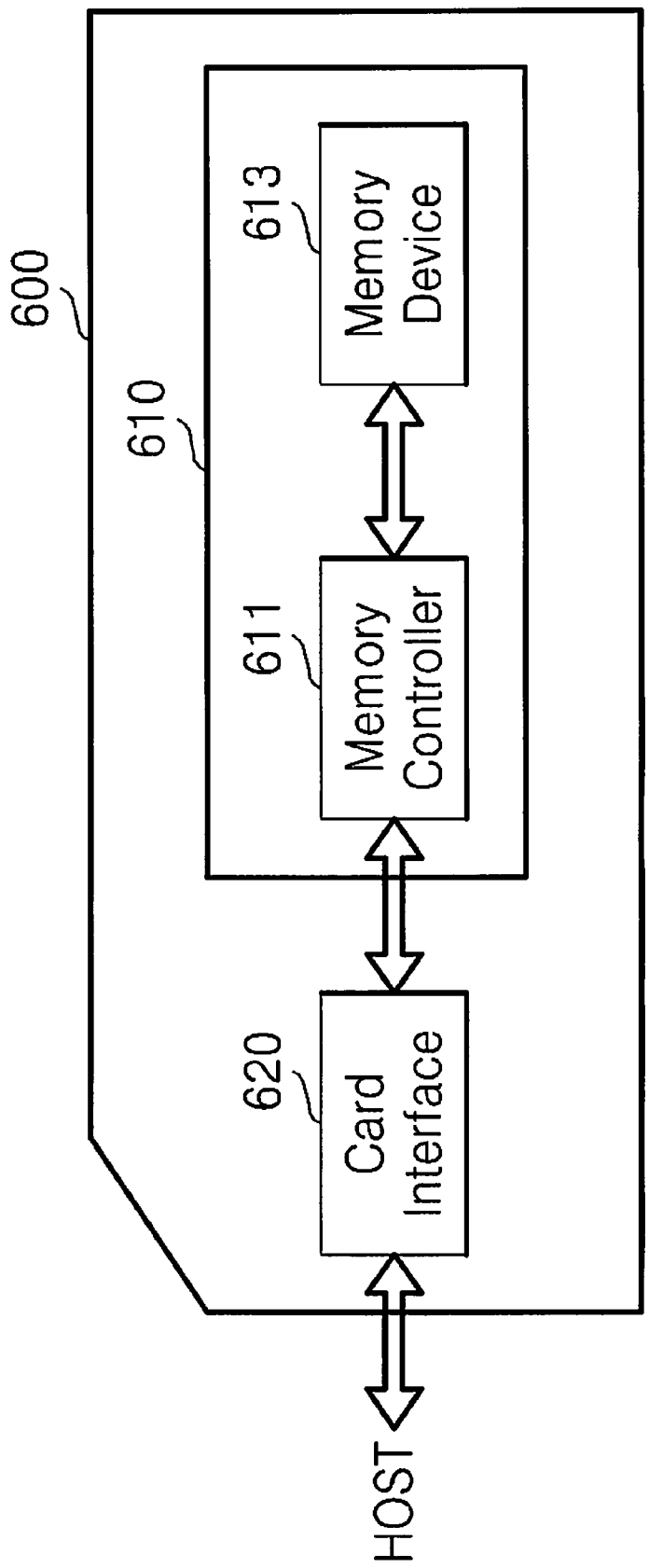
FIG. 6 illustrates an example embodiment of a system including the die package shown in FIG. 1 or 2.

FIG. 6 illustrates an example embodiment of a system having the die package 100, 200 shown in FIG. 1 or 2. Referring to FIG. 6, the system 600 may be embodied into memory card or smart card. The system 600 may include memory device 613, memory controller 611, and/or card interface 620.

The memory device 613 and/or the memory controller 611 may be embodied into a die package 610. The die package 610 may be mounted on a system board (not shown). The die package 610 denotes the die package 100 of FIG. 1 or the die package 200 of FIG. 2. System 600 may include a memory controller instead of the processor 140 of FIG. 1 and/or the processor 240 of FIG. 2.

The memory device 613 denotes the first die 150, the second die 160 of FIG. 1, a component implemented by combination of the first die 150 and the second die 160, the die 250, 260, 270, or 280 of FIG. 2, or a component implemented by combination of the dies 250, 260, 270, and 280. The memory controller 611 may control data exchanging between the memory device 613 and the card interface 620.

The card interface 620 may be a secure digital (SD) card interface or a multi-media card (MMC) interface, but the embodiment is not restricted thereto. The card interface 620 may interface data exchanging between a host HOST and the memory controller 611 according to a protocol of the host HOST.

When the system is connected to a host HOST such as computer, digital camera, digital audio player, mobile phone, console video game hardware, or digital set-top box, the host HOST may exchange data stored in the memory device 613 through the card interface 620 and/or the memory controller 611.

Figure 7:
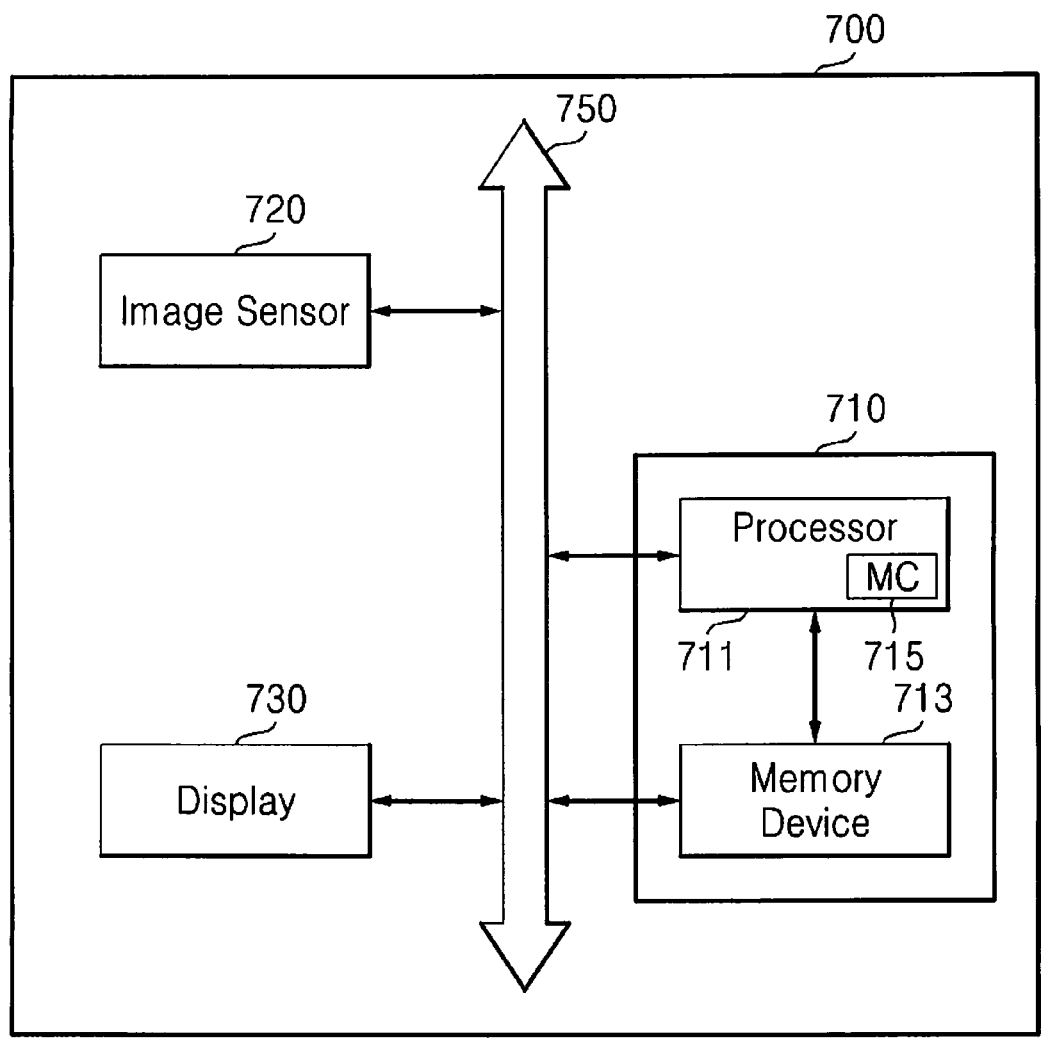
FIG. 7 illustrates an example embodiment of a system including the die package shown in FIG. 1 or 2.

FIG. 7 illustrates an example embodiment of a system having the die package 100, 200 shown in FIG. 1 or 2. Referring to FIG. 7, the system 700 may be embodied into a digital camera or a portable device with digital camera.

The system 700 may include processor 711 controlling the general operation of the system 700, memory device 713, and/or bus 750. The processor 711 and/or the memory device 713 may be embodied into a die package 710. The die package 710 may be mounted on a system board (not shown). System 700 may include a memory controller 715 instead of the processor 140 of FIG. 1 and/or the processor 240 of FIG. 2.

The processor 711 denotes the processor 140 of FIG. 1 or the processor 240 of FIG. 2. The memory device 713 denotes the first die 150, the second die 160 of FIG. 1, a component implemented by combination of the first die 150 and the second die 160, the die 250, 260, 270, or 280 of FIG. 2, or a component implemented by combination of the dies 250, 260, 270, and 280.

An image sensor 720 of the system 700 may convert optical images into digital images, and the converted digital signal may be stored in the memory device 713 and/or displayed through a display 730 under the control of the processor 711. Also, the digital signal stored in the memory device 713 may be displayed through the display 730 under the control of the processor 711.

Figure 8:
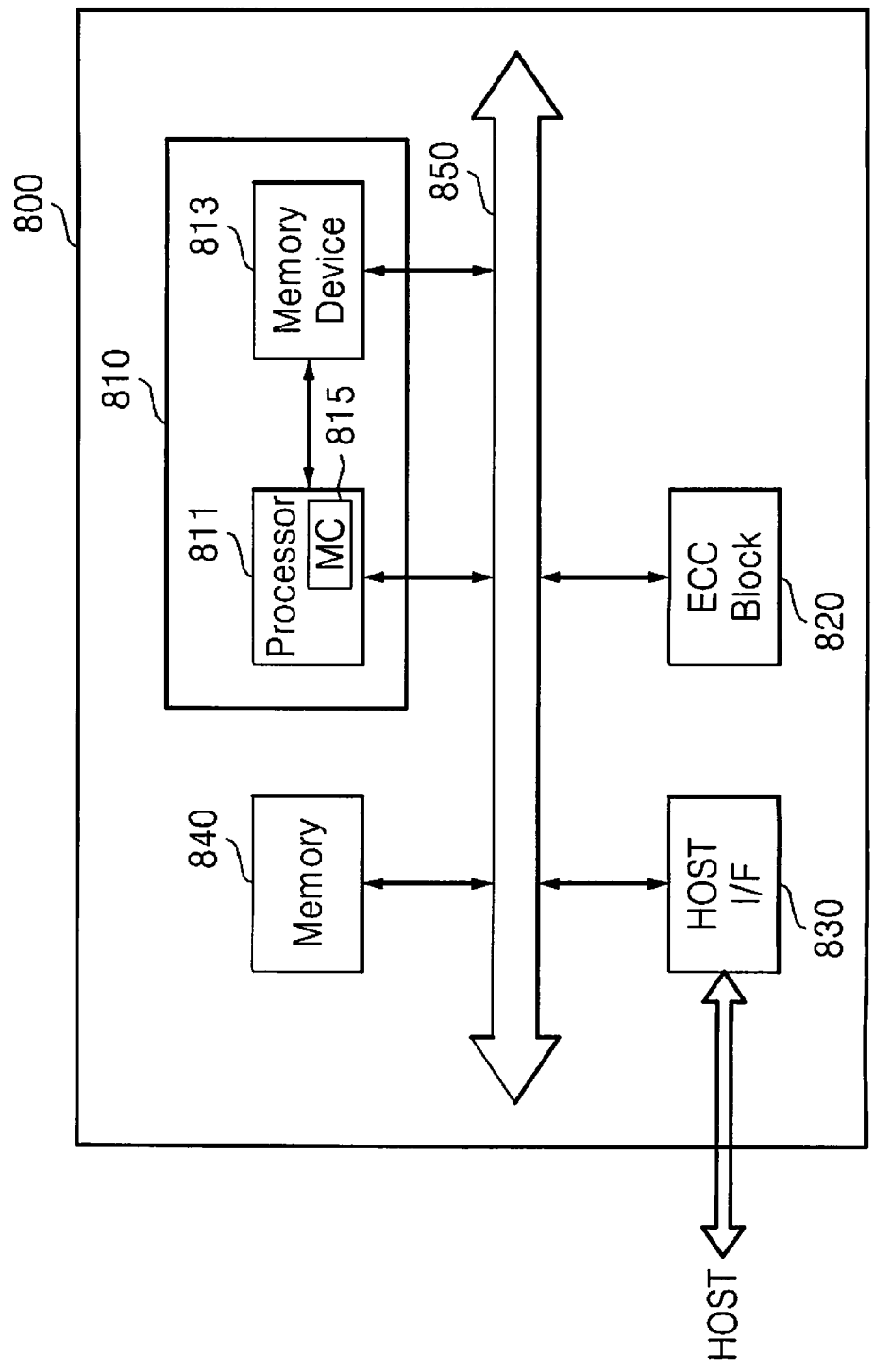
FIG. 8 illustrates an example embodiment of a system including the die package shown in FIG. 1 or 2.

FIG. 8 illustrates an example embodiment of a system having the die package 100, 200 of FIG. 1 or 2. Referring to FIG. 8, the system 800 may include memory device 813 and/or processor 811 for controlling the general operation of the system 800.

The memory device 813 and/or the processor 811 may be embodied into a die package 810. The die package 810 may be mounted on a system board (not shown). The die package 810 denotes the die package 100 of FIG. 1 or the die package 200 of FIG. 2. The processor 811 may include a memory controller 815 to control the operation of the memory device 813.

The system 800 may include a memory 840 capable of being used as an operation memory of the processor 811. The memory 840 may be embodied into a non-volatile memory such as read only memory (ROM) or flash memory. A host HOST connected to the system 800 may exchange data with the memory device 813 through the processor 811 and/or the host interface (I/F) 830. Memory controller 815 may perform the function of memory interface.

The system 800 may further include an error correction code (ECC) block 820. The ECC block 820 operated by the control of the processor 811 may detect and/or correct an error included in a data read from the memory device 813 through the memory controller 815.

The processor 811 may control exchanging data among the ECC block 820, the host interface 830, and/or the memory 840 through bus 850.

The system 800 may be embodied into a Universal Serial Bus (USB) memory drive or a memory stick.

Figure 9:
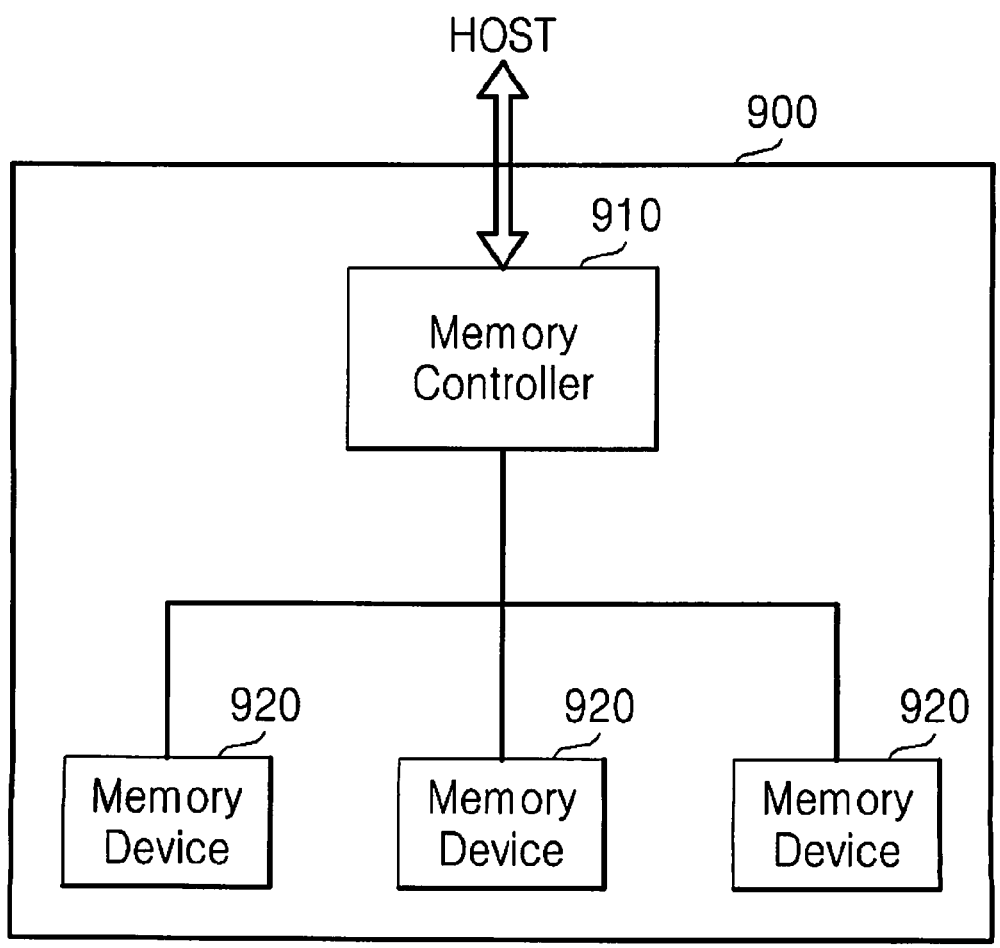
FIG. 9 illustrates an example embodiment of a system including the die package shown in FIG. 1 or 2.

FIG. 9 illustrates an example embodiment of a system having the die package 100, 200 of FIG. 1 or 2. Referring to FIG. 9, the system 900 may be embodied into a data storage device such as solid state drive (SSD). The system 900 may include memory controller 910 for controlling each data processing operation of a plurality of memory devices 920. The system 900 may be embodied into a memory module.

Also, the system 900 may be embodied into the die package 100 of FIG. 1 or the die package 200 of FIG. 2. System 900 may include memory controller 910 instead of the processor 140 of FIG. 1 or the processor 240 of FIG. 2. The memory device 910 denotes a component implemented by combination of the first die 150 and the second die 160 of FIG. 1, or a component implemented by combination of the dies 250, 260, 270, and 280 of FIG. 2.

The die package according to example embodiments may reduce processing burden of the die package by attaching dies on both sides of the interposer. Also, the die package may reduce overhead of a die size by only a portion of the plurality of dies having vertical electrical connection means.

While example embodiments have been particularly shown and described, it will be understood by those of ordinary skill in the art that various changes in form and details may be made therein without departing from the spirit and scope of the present invention as defined by the following claims.

What is claimed is:

1. A die package, comprising:
a package substrate;
an interposer;
at least one first die connected between the package substrate and the interposer;
at least one second die mounted on the interposer; and
a processor mounted on the interposer and separated from the at least one second die;
wherein the at least one first die and the at least one second die are overlapped in a vertical direction, and
wherein the at least one first die and the processor are not overlapped in the vertical direction.

2. The die package of claim 1, wherein the processor is connected to the interposer through microbumps.

3. The die package of claim 1, wherein the at least one first die is embodied by two stacked dies,
wherein either one of the two stacked dies includes vertical electrical connections, and
wherein the other one of the two stacked dies does not include vertical electrical connections.

4. The die package of claim 3, wherein the two stacked dies are connected through the vertical electrical connections.

5. The die package of claim 3, wherein either one of the two stacked dies is connected to the interposer through microbumps.

6. The die package of claim 1, wherein the at least one first die and the at least one second die are entirely overlapped in a vertical direction, and
wherein the at least one first die and the processor are not at all overlapped in the vertical direction.

7. The die package of claim 1, wherein the at least one first die is a volatile memory device or a non-volatile memory device.

8. The die package of claim 1, wherein the at least one second die is embodied by two stacked dies,
wherein either one of the two stacked dies includes vertical electrical connections, and
wherein the other one of the two stacked dies does not include vertical electrical connections.

9. The die package of claim 8, wherein the two stacked dies are connected through the vertical electrical connections.

10. A system, comprising:
a system board; and
a die package mounted on the system board;
wherein the die package includes:
- a package substrate;
- an interposer;
- at least one first die connected between the package substrate and the interposer;
- at least one second die mounted on the interposer; and
- a processor mounted on the interposer and separated from the at least one second die;

wherein the processor controls data processing operations of the at least one first die and the at least one second die,
wherein the at least one first die and the at least one second die are overlapped in a vertical direction, and
wherein the at least one first die and the processor are not overlapped in the vertical direction.

11. The system of claim 10, wherein the processor is a central processing unit (CPU) or a graphic processing unit (GPU).

12. The system of claim 10, wherein the system further comprises:
a display for displaying data processed by the processor.

13. The system of claim 10, wherein the system is a portable device.

14. A die package, comprising:
a package substrate;
at least one first die on the package substrate;
an interposer stacked on the at least one first die and electrically connected to the at least one first die through first microbumps; and
at least one second die stacked on the interposer and electrically connected to the at least one first die through second microbumps;
wherein the at least one second die is stacked on the at least one first die through the interposer, and
wherein the at least one first die and the at least one second die are entirely overlapped in a vertical direction.

15. The die package of claim 14, further comprising:
a processor on the interposer.

16. A semiconductor device comprising the die package of claim 1.

17. A semiconductor device comprising the die package of claim 14.

18. The die package of claim 14, wherein a size of the at least one first die is identical to a size of the at least one second die.

19. The die package of claim 1, wherein a horizontal dimension of the at least one first die is the same as a horizontal dimension of the at least one second die.

20. The die package of claim 15, wherein the processor is separated from the at least one second die.

* * * * *